(12) United States Patent
Gilbert et al.

(10) Patent No.: US 6,878,271 B2
(45) Date of Patent: Apr. 12, 2005

(54) IMPLEMENTATION OF MICROFLUIDIC COMPONENTS IN A MICROFLUIDIC SYSTEM

(75) Inventors: John Richard Gilbert, Brookline, MA (US); Manish Deshpande, Canton, MA (US)

(73) Assignee: Cytonome, Inc., Watertown, MA (US)

( * ) Notice: Subject to any disclaimer, the term of this patent is extended or adjusted under 35 U.S.C. 154(b) by 0 days.

(21) Appl. No.: 10/329,018

(22) Filed: Dec. 23, 2002

(65) Prior Publication Data

US 2004/0045891 A1 Mar. 11, 2004

Related U.S. Application Data

(60) Provisional application No. 60/410,685, filed on Sep. 13, 2002, and provisional application No. 60/409,489, filed on Sep. 9, 2002.

(51) Int. Cl.[7] .............................................. B01D 63/00
(52) U.S. Cl. ......................... 210/321.61; 210/321.75; 210/321.84; 422/101; 422/102; 216/2
(58) Field of Search ..................... 210/321.61, 321.75, 210/321.84; 435/287.2, 288.1, 288; 422/101, 102; 216/2

(56) References Cited

U.S. PATENT DOCUMENTS

| | | | |
|---|---|---|---|
| 5,922,210 A | * 7/1999 | Brody et al. ................. 210/767 |
| 5,922,591 A | * 7/1999 | Anderson et al. ......... 435/287.2 |
| 5,948,227 A | 9/1999 | Dubrow |
| 5,948,441 A | 9/1999 | Lenk et al. |
| 5,962,081 A | * 10/1999 | Ohman et al. .............. 427/534 |
| 6,007,775 A | 12/1999 | Yager |
| 6,042,709 A | 3/2000 | Parce et al. |
| 6,046,056 A | 4/2000 | Parce et al. |
| 6,168,948 B1 | 1/2001 | Anderson et al. |
| 6,187,190 B1 | 2/2001 | Smith et al. |
| 6,197,595 B1 | 3/2001 | Anderson et al. |
| 6,440,725 B1 | * 8/2002 | Pourahmadi et al. ..... 435/288.5 |

OTHER PUBLICATIONS

Gao et al. "Integrated Microfluidic System Enabling Protein Digestion, Peptide Separation, and Protein Identification." *Anal. Chem* 2001, 73, 2648–2655.
Jiang et al. "Integrated Plastic Microfluidic Devices with ESI–MS for Drug Screening and Residue Analysis." *Anal. Chem.* 2001, 73, 2048–2053.
Wang et al. "Integration of Polymeric Membranes with Microfluidic Networks for Bioanalytical Applications." *Electrophoresis* 2001, 22, 3857–3867.
Wang et al. "High Resolution Chiral Separation Using Microfludics–based Membrane Chromatography." *Journal of Chromatography A* 942 (2002) 115–122.
Xiang et al. "An Integrated Microfabricated Device for Dual Microdialysis and On–Line ESI–Ion Trap Mass Spectrometry for Analysis of Complex Biological Samples." *Anal. Chem.* 1999, 71, 1485–1490.
Xu et al. "A Microfabricated Dialysis Device for Sample Cleanup in Electrospray Ionization Mass Spectrometry." *Anal. Chem.* 1998, 70 3553–3556.

* cited by examiner

Primary Examiner—W. L. Walker
Assistant Examiner—K S Menon
(74) Attorney, Agent, or Firm—Lahive & Cockfield, LLP; Elizabeth A. Hanley; Anthony A. Laurentano (57) ABSTRACT

A system and method for integrating microfluidic components in a microfluidic system enables the microfluidic system to perform a selected microfluidic function. A capping module includes a microfluidic element for performing a microfluidic function. The capping module is stacked on a microfluidic substrate having microfluidic plumbing to incorporate the microfluidic function into the system.

5 Claims, 6 Drawing Sheets

IMPLEMENTATION OF MICROFLUIDIC COMPONENTS IN A MICROFLUIDIC SYSTEM

RELATED APPLICATIONS

The present invention claims priority to U.S. Provisional Patent Application Ser. No. 60/409,489 filed Sep. 9, 2002, and U.S. Provisional Patent Application Ser. No. 60/410,685, filed Sep. 13, 2002 the contents of which are herein incorporated by reference.

FIELD OF THE INVENTION

The present invention relates to a microfluidic system for handling fluid samples on a microfluidic level. More particularly, the present invention relates to a system and method for implementing microfluidic functions in a microfluidic system.

BACKGROUND OF THE INVENTION

Microfluidic devices and systems provide improved methods of performing chemical, biochemical and biological analysis and synthesis. Microfluidic devices and systems allow for the performance of multi-step, multi-species chemical operations in chip-based micro chemical analysis systems. Chip-based microfluidic systems generally comprise conventional 'microfluidic' elements, particularly capable of handling and analyzing chemical and biological specimens. Typically, the term microfluidic in the art refers to systems or devices having a network of processing nodes, chambers and reservoirs connected by channels, in which the channels have typical cross-sectional dimensions in the range between about 1.0 $\mu$m and about 500 $\mu$m. In the art, channels having these cross-sectional dimensions are referred to as 'microchannels'.

In the chemical, biomedical, bioscience and pharmaceutical industries, it has become increasingly desirable to perform large numbers of chemical operations, such as reactions, separations and subsequent detection steps, in a highly parallel fashion. The high throughput synthesis, screening and analysis of (bio)chemical compounds, enables the economic discovery of new drugs and drug candidates, and the implementation of sophisticated medical diagnostic equipment. Of key importance for the improvement of the chemical operations required in these applications are an increased speed, enhanced reproducibility, decreased consumption of expensive samples and reagents, and the reduction of waste materials.

In the fields of biotechnology, and especially cytology and drug screening, there is a need for high throughput filtration of particles. Examples of particles that require filtration are various types of cells, such as blood platelets, white blood cells, tumorous cells, embryonic cells and the like. These particles are especially of interest in the field of cytology. Other particles are (macro) molecular species such as proteins, enzymes and poly-nucleotides. This family of particles is of particular interest in the field of drug screening during the development of new drugs.

SUMMARY OF THE INVENTION

The present invention provides a system and method for integrating microfluidic components in a microfluidic system to enable the microfluidic system to perform a selected microfluidic function. The present invention utilizes a capping module including a microfluidic element for performing a microfluidic function. The capping module is stacked on a microfluidic substrate having microfluidic plumbing to incorporate the microfluidic function into the system.

According to one aspect, the invention provides a microfiltration system in a microfluidic chip for separating a substance, such as a compound, moving through a closed channel system of capillary size into different components. The filtration system of the invention provides a filtration module that can be assembled at low cost while providing an accurate means of filtering a large amount of compounds per unit of time. The microfiltration system integrates conventional membrane filter technology into a microfluidic system formed of glass, plastic or other suitable material. The microfabricated filtration system may comprise a subsystem designed to be inserted into a standard microfluidic system to provide on-chip filtration. An illustrative filtration system includes two flow paths separated by a membrane, which separates a substance flowing through a first flow path by size discrimination. Reservoirs are formed on either side of the membrane in communication with the flow paths. A microfabricated cap is affixed to the membrane to define the reservoir on the top side of the membrane.

According to another aspect, an electromagnetic valve may be incorporated into a microfluidic system using a capping structure having electromagnetic valve components formed therein. The electromagnetic valve components include a membrane for selectively blocking flow through one or more communication ports in a substrate and an actuator assembly for controlling the position of the membrane.

BRIEF DESCRIPTION OF THE DRAWINGS

FIG. 9b is a perspective cross-sectional view of the microfiltration system of FIG. 9a.

DETAILED DESCRIPTION OF THE INVENTION

The present invention provides a microfabricated filtration system for allowing on-chip filtration, purification or separation of a sample. The microfabricated filtration system may be used in a wide variety of applications, including, but not limited to blood separation and filtration, microdialysis, microchemical analysis and synthesis applications that require a filtration or dialysis subsystem and other microfluidic application. The present invention will be described below relative to an illustrative embodiment. Those skilled in the art will appreciate that the present invention may be implemented in a number of different applications and embodiments and is not specifically limited in its application to the particular embodiments depicted herein.

As used herein, the term "microfluidic" refers to a system or device for handling, processing, ejecting and/or analyzing a fluid sample including at least one channel having microscale dimensions.

The terms "channel" and "flow channel" as used herein refers to a pathway formed in or through a medium that allows for movement of fluids, such as liquids and gases. The channel in the microfluidic system preferably have cross-sectional dimensions in the range between about 1.0 $\mu$m and about 500 $\mu$m, preferably between about 25 $\mu$m and about 250 $\mu$m and most preferably between about 50 $\mu$m and about 150 $\mu$m. One of ordinary skill in the art will be able to determine an appropriate volume and length of the flow channel. The ranges are intended to include the above-recited values as upper or lower limits. The flow channel can have any selected shape or arrangement, examples of which include a linear or non-linear configuration and a U-shaped configuration.

The term "microfluidic element" as used herein refers to a component in a microfluidic system for performing a microfluidic function, including, but not limited to: passive check valves, active valves, pressure sensors, connecting channels, membrane filtration units, threaded taps for external connecting tubes, compression chambers, pumps, and others that may be known to those of ordinary skill in the art.

The term "membrane" or "filter" as used herein refers to a material of any suitable composition and size which may used to separate or filter substances by size exclusion or other measures.

The term "substrate" as used herein refers to a support structure having channels formed therein for conveying a fluid.

The terms "cap" or "capping module" as used herein refer to a structure, which is the same size as or smaller than a substrate, having any selected size or shape and formed of any selected material, and having a microfluidic element. The capping module is configured to stack on or communicate with the substrate to fully or partially complete a fluid path.

The term "substance" as used herein refers to any material used in a microfluidic process, including, but not limited to chemical compounds, molecules, viruses, cells, particles, beads, buffers, or any other material used in a microfluidic process.

The term "microfluidic function" as used herein refers to any operation, function or process performed or expressed on a fluid or sample in a microfluidic system, including, but not limited to: filtration, dialysis, pumping, fluid flow regulation, controlling fluid flow and the like.

The term "port" refers to a structure for providing fluid communication between two elements.

As used herein, "pump" refers to a device suitable for intaking and discharging fluids and can have different sizes, including microscale dimensions, herein referred to as "micropump."

Figure 1:
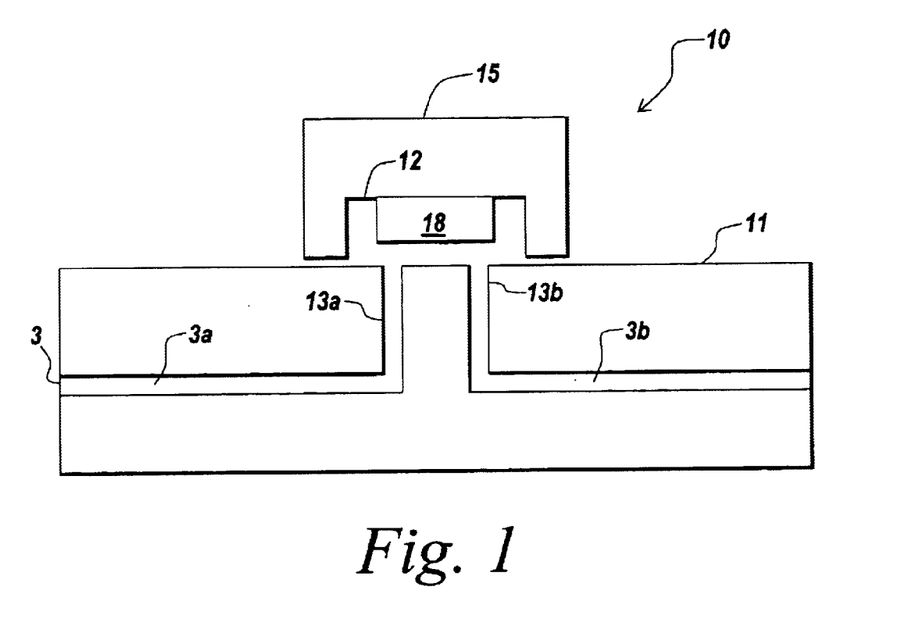
FIG. 1 illustrates a microfluidic system including a capping structure for integrating a microfluidic function into the microfluidic system.

The present invention allows implementation of different microfluidic functions into a microfluidic chip using a capping module having a microfluidic element for performing a microfluidic function. As shown in FIG. 1, a microfluidic chip 10 suitable for implementing an embodiment of the invention comprises a substrate 11 having one or more flow channels 3, illustrated as a microchannel, disposed therein. The flow channels transport fluid through the microfluidic system 10 for processing, handling, and/or performing any suitable operation on a liquid sample. The microfluidic system 10 may comprise any suitable number of flow channels 3 for transporting fluids through the microfluidic system 10.

As shown in FIG. 1, the flow channel 3 is formed in a substrate 11, and may connect to the surface of the substrate via one or more communication ports 13a and 13b. A capping module 15 including a microfluidic element 18, such as a filter, one or more valves, pressure sensors or other component for performing a microfluidic function, is placed over the substrate 11 to form a closed fluid path. According to an alternate embodiment, the capping module may include a connector channel for re-routing fluid flow through the microchannel around another structure. The illustrative substrate 11 includes two communication ports 13a, 13b, each connecting unconnected segments 3a, 3b of the flow channel 3 to the substrate surface, though one skilled in the art will recognize that variations may be made in the size, number and configuration of the communication ports and flow channels.

The illustrative capping module 15 may include connector ports for interfacing with the communication ports of the substrate, and/or a chamber 12 or channel to provide a fluidic path between the first connector port and the second connector port. One skilled in the art will recognize that the capping module may have alternate configurations and is not limited to the embodiment shown in FIG. 1.

Using the capping module 15, microfluidic functions, such as filtration, dialysis, pumping, flow control and so on, may be integrated into the microfluidic system 10 without requiring significant modification of the substrate 11. A substrate including any number and arrangement of conduits or channels 3 for conveying fluids can be transformed into a functional fluidic circuit by selecting and placing one or more capping modules 15 with a functional microfluidic element 18 on the substrate, i.e. chip. According to an illustrative embodiment, the same automated "pick and place" surface mount equipment technology used to make integrated circuits may be used to form fluidic circuits on a substrate having microchannels using various capping structures. Suitable pick and place equipment is manufactured by Manncorp, Inc. (Huntingdon Valley, Pa.), among others.

To fabricate a fluidic circuit, the channels 3 in the substrate 11 may be manufactured by chip microfabrication. The channels or plumbing may be fabricated by etching half-channels in a first substrate, followed by bonding and/or lamination of a second substrate to enclose the half-channels, forming a microchannel. The substrate may be formed of one or more layers containing etched channels if more complex fluidic networks are required. The communication ports may then be fabricated in the substrate to connect the microchannel to an exterior surface of the substrate. Suitable techniques for fabricating the communication ports include drilling, laser etching, powder blasting or other techniques known in the art. After the fabrication of the substrate and communication ports, a capping module having a desired functionality is bonded to the substrate to form a microfluidic component in the larger microfluidic circuit.

A variety of capping module number and sizes may be bonded to the substrate to impart various microfluidic functions to form a microfluidic system. The capping modules may be removable and replaceable so that a substrate may be re-used.

According to the illustrative embodiment, the capping module has a cross-sectional dimension of between about 1 millimeter and about 5 centimeters, though those skilled in the art will recognize that the invention is not limited to this range. The capping module may be formed of any suitable material, including, but not limited to plastic, glass, silicon and other materials known in the art.

Figure 2:
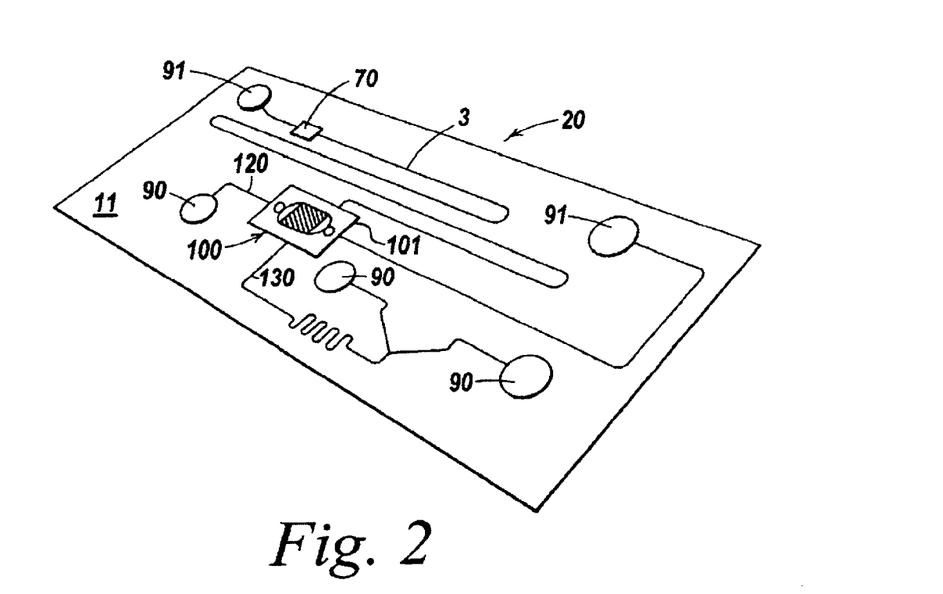
FIG. 2 illustrates a diagnostic microfluidic chip suitable for including a microfiltration system according to an illustrative embodiment of the invention.

FIG. 2 illustrates the architecture of an illustrative microfluidic diagnostic chip that may be fabricated according to the teachings of the invention. The diagnostic chip 20 may include one or more microfluidic components, alone or in combination, configured to facilitate processing of a sample. For example, as shown, the diagnostic chip 20 includes a microfiltration system 100 for separating substances in solution, such as separating selected particles from cells or other particles in a suspension. The diagnostic chip 20 may further include one or more reservoirs 90 for storing and supplying sample, reagent or other compounds to the system, as well as one or more waste reservoirs 91 for collecting sample waste. The diagnostic chip may further include one or more aliquoting, mixing and incubation components, such as an on-chip sample dilution system, for processing a sample, such as performing a mixture of a specific amount of sample and reagent. For example, the illustrative system includes a mixing component 60 and an incubation region 61. The chip may also include a detector 70 for analyzing a filtered product from the microfiltration system 100. The detector 70 may utilize any suitable detection modality, including, but not limited to fluorescence, electrochemical analysis, dielectrophoresis, and surface plasma resonance (SPR), radio-frequency, thermal analysis and combinations thereof. The chip 10 may employ valves for selectively controlling the flow of fluid through the channels and one or more drive units, located on or off the chip, for driving the movement of fluid through the channels 3 of the chip. One skilled in the art will recognize that the microfluidic system is not limited to the diagnostic chip of FIG. 2 and that variations in the configuration, position, number and combination of the various microfluidic components may be made in accordance with the present invention.

The filtration system 100 of the present invention integrates conventional membrane filter technology into a microfluidic chip using a capping module. The filtration system can be inserted into an existing microfluidic chip to enable filtration of particles, cells or other substances in suspension without requiring significant or expensive modification of the chip structure.

Figure 3:
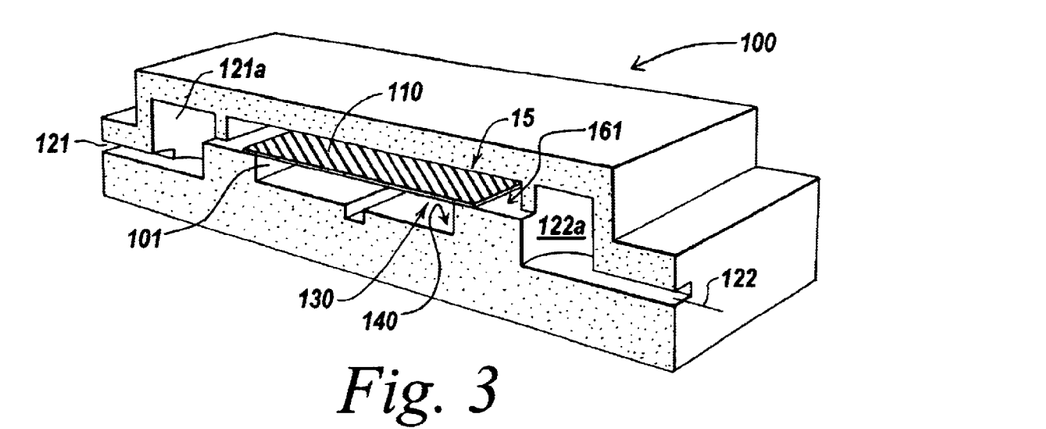
FIG. 3 is a perspective, cross-sectional view of the microfiltration system in the chip of FIG. 2 according to an illustrative embodiment of the invention.
Figure 4:
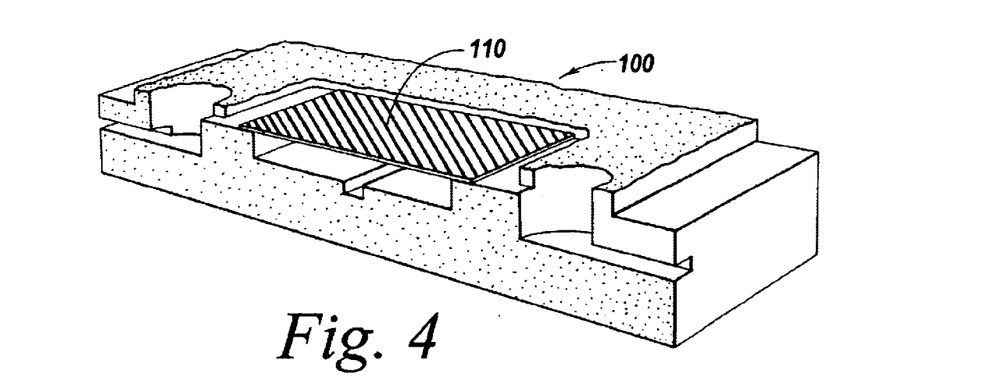
FIG. 4 is a detailed view of the membrane on the microfiltration system of FIG. 3.
Figure 5:
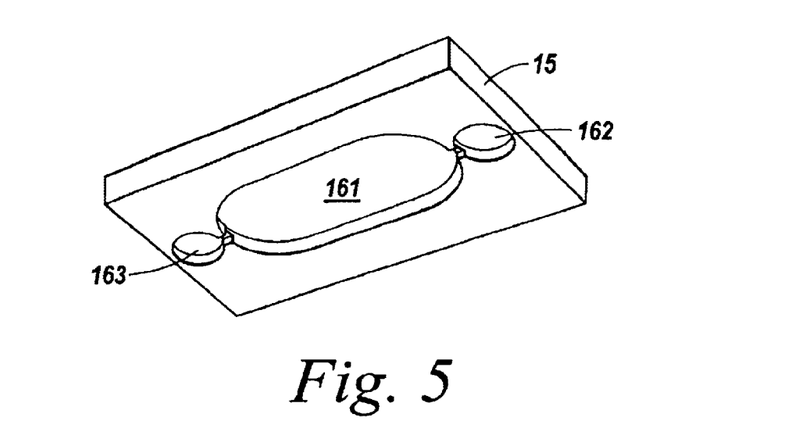
FIG. 5 illustrates the microfabricated cap of the microfiltration system of FIG. 3.
Figure 6:
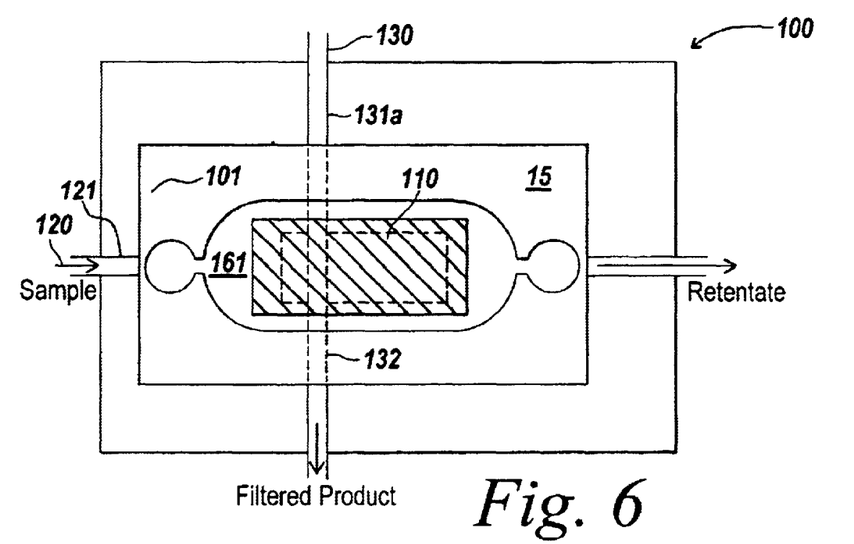
FIG. 6 is a top view of the microfiltration system of FIG. 3.

FIGS. 3, 4 and 6 illustrate a microfabricated filtration subsystem 100 suitable for implementation in the microfluidic system of FIG. 2 according to one embodiment of the invention. FIG. 5 illustrates the capping module 15 used to fabricate the filtration system 100 according to one embodiment of the invention. The filtration subsystem is utilized to separate a substance, such as a sample comprising a mixture of particles and fluid, through a membrane 110 and subsequently collect the separated components. According to an illustrative embodiment, the filtration subsystem is used to separate blood cells from plasma, though one skilled in the art will recognize that other applications are included in the invention. According to other applications, the filtration system may be used to separate viruses from cells, beads from cells, chemical compounds, molecules or other substances that a membrane may be used to separate. As shown the filtration subsystem 100 is formed directly on the microfluidic chip to add filtration capability to the chip without requiring significant modification or expense.

The filtration subsystem 100 utilizes a conventional membrane filter 110 separating two flow paths in the substrate 11 to provide small volume controllable filtration of a sample. The illustrative filtration system is a four-port transverse filter, which includes a first fluid flow path 120 for supplying a substance to the filtration system, such as a mixture of particles and fluid, and a second fluid flow path 130 for receiving and conveying a filtered product (i.e., a filtrate) from the filtration system. The first fluid flow path 120 includes a first communication port, illustrated as a first inlet channel 121 that intersects the filtration system at a first inlet 121a. The first fluid flow path 120 includes a second communication port, illustrated as a first outlet channel 122 including an outlet 122a from the filtration chamber for receiving and conveying a retentate of the substance from the filtration system. The second fluid flow path includes an inlet channel 131 intersecting a filtrate chamber below the membrane 110 at a second inlet and a second outlet channel 132 for transferring the filtered product from the filtration system. The second fluid flow path 130 may include a carrier fluid for conveying the filtered product. A flow source drives the flow of the mixture through the filtration system to effect separation of the components through the membrane. The flow source may comprise an off-chip syringe pump, a microfabricated peristaltic pump, a microfabricated syringe, or any suitable flow source known in the art, such as those described in U.S. Provisional Patent Application Ser. No. 60/391,868 entitled "Microfluidic System and Components", (Attorney Docket Number CVZ-019-2), the contents of which are herein incorporated by reference.

The illustrative microfabricated filtration system 100 has a relatively small footprint (less than about one $mm^2$), resulting in a compact structure, low cost and relatively simple fabrication. The particle separator further provides relatively low strain rates with reduced or no blockage. The amount of fluid retained can be significant, if desired, and the design is scalable and repeatable for additional parsing steps, if desired.

The filtration subsystem of the present invention may be formed by providing a microfluidic chip including an intersection 101 of the two flow channels 120, 130. The assembly process integrates simple batch fabricated components, and is relatively simple and low cost at high volume. According to an illustrative embodiment, the chip forms a recess 140 in communication with the second flow channel 130 at the intersection 101. The first flow channel 120 is initially separated from and divided by the recess 140. A suitable membrane 110 is affixed to the microfluidic chip, using an appropriate adhesive or other suitable fastening mechanism, to cover the recess, thereby defining a reservoir below the membrane for receiving the filtered product and transmitting the filter product through the second flow channel 130. The membrane may comprise any suitable filtering membrane known in the art.

The illustrative microfabricated capping module 15, shown in FIG. 5, is affixed above the membrane 110 to define a filtration chamber 161 in communication with the first flow channel 120. The cap 15 may be affixed using an appropriate adhesive or other suitable fastening mechanism. The illustrative capping module 15 includes an inlet 162 and an outlet 163 in communication with the filtration chamber to connect the first flow channel 120 with the filtration chamber 161 and enable flow of a composition to be filtered through the filtration chamber over the membrane. Alternatively, the membrane 110 is affixed directly to the capping module 15 and the capping module is affixed to the substrate to integrate the filtration system onto the substrate. One skilled in the art will recognize that the capping module is not limited to the illustrative embodiment and that variations may be made in accordance with the teachings of the invention.

Figure 7:
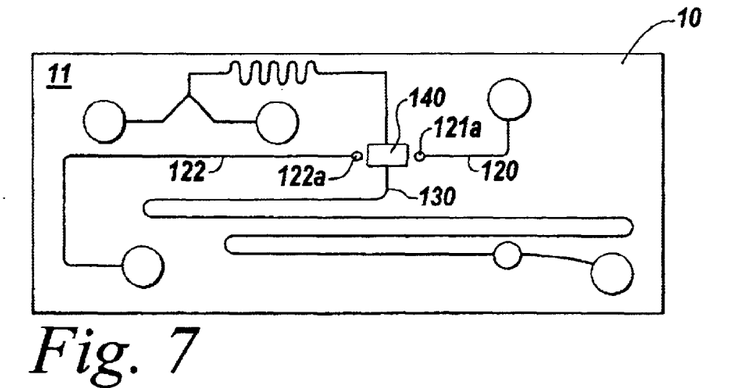
FIG. 7 is a top view of the diagnostic chip of FIG. 2 before assembly of the microfiltration system.
Figure 8:
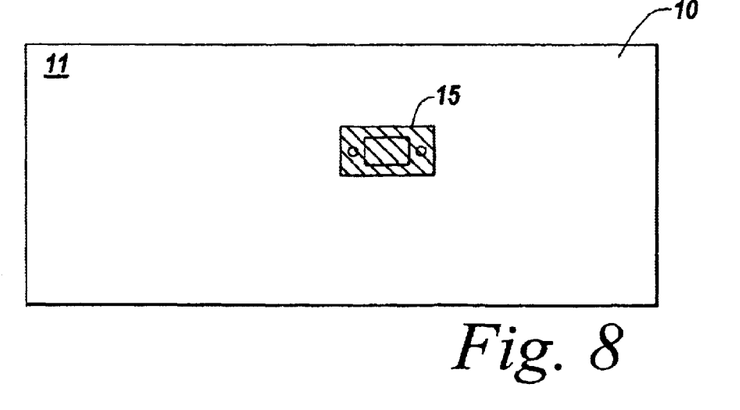
FIG. 8 is a top view of the diagnostic chip of FIG. 2 after assembly of the microfiltration system.

FIG. 7 illustrates the microfluidic system 10 including channels 3 prior formed therein prior to assembly of the capping module 15 including the membrane 110. FIG. 8 is a top view of the capped microfluidic system 10 incorporating filtering capability.

The composition to be filtered is introduced to the filtration subsystem from the inlet channel and passes into the filtration chamber and over the membrane 110. The components of the substance are fractionated by the membrane 110, with the smaller components, such as plasma, passing through the membrane, into the reservoir 140 and through the second flow channel 130. The remaining portion, such as blood cells, passes through the filtration chamber to the outlet of the first flow channel 120.

According to the illustrative embodiment, the substrate of the microfluidic chip may be formed of glass, plastic, silicon, quartz, ceramics or any other suitable material. In a microfluidic chip manufactured from glass, the chip may comprise two layers: the chip and the cap affixed to the chip to define the filtration subsystem. In a microfluidic chip formed of plastic, the components may be stamped into the plastic substrate.

Figure 9A:
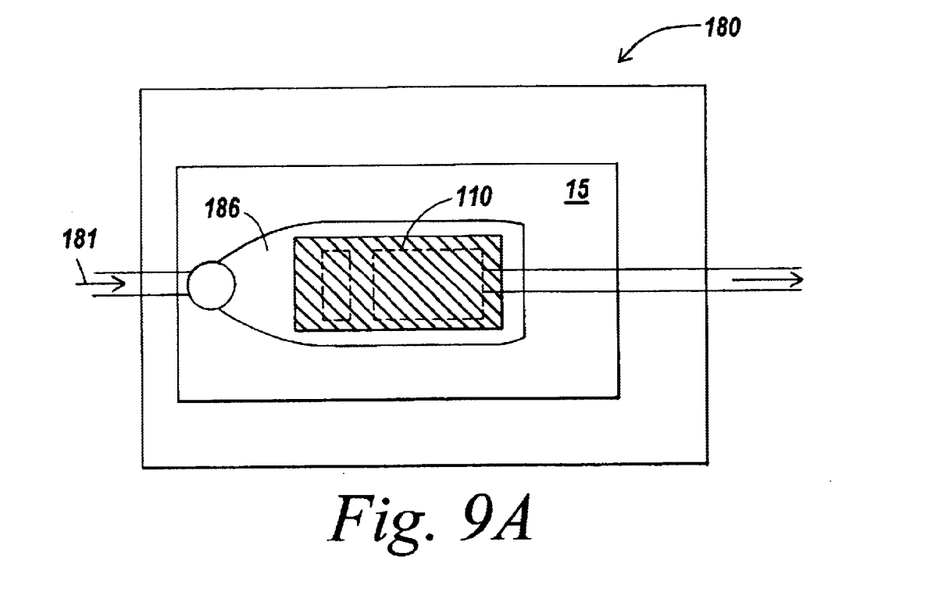
FIG. 9a is a top view of a two port direct microfiltration system according to an alternate embodiment of the invention.
Figure 9B:
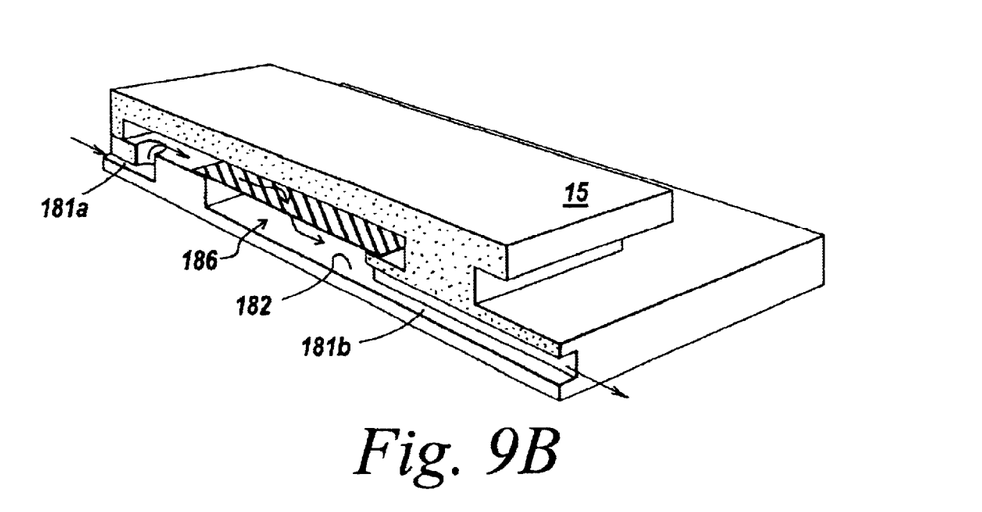

According to an alternate embodiment, shown in FIGS. 9a and 9b, the microfiltration subsystem may comprise a two-port direct filter 180 comprising a membrane 110 inserted into a fluid flow path 181. As shown, the two-port direct filter 181 comprises a fluid flow path 181 formed in a microfluidic substrate, which is divided into two sections 181a, 181b. The second section 181b defines a recess 182 and the membrane 110 is adhered over the recess to define a filtrate chamber for receiving a filtered product. A microfabricated cap 15 including a recess 186 defining a filtration chamber is attached to substrate above the membrane to connect the flow path 181. The substance to be filtered is conveyed through the fluid flow path 181 into the filtration chamber 186 and passes through the membrane 110. The membrane 110 separates the substance by trapping larger molecules and the filtered product, comprising the remaining molecules, passes through the membrane along the fluid flow path 181 into the recess 182 and out of the microfiltration system for further analysis, processing collection, etc.

Figure 10A:
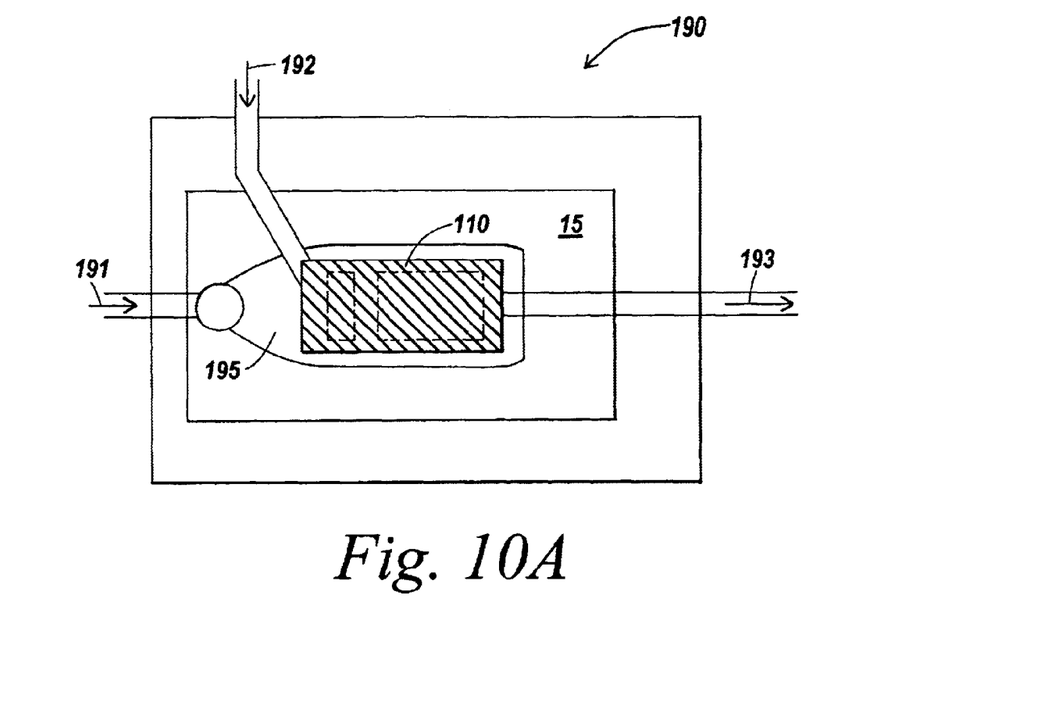
FIG. 10a is a top view of a three port direct microfiltration system according to an alternate embodiment of the invention.
Figure 10B:
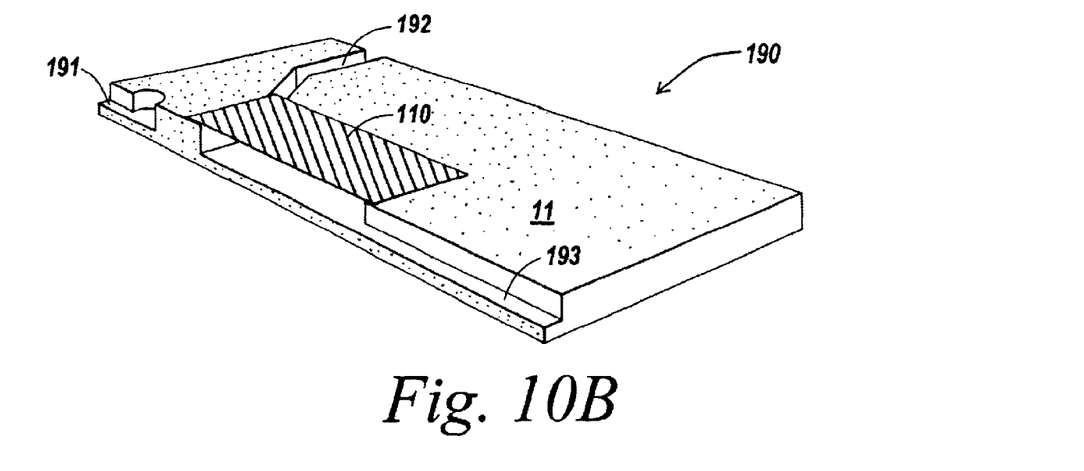
FIG. 10b is a perspective cross-sectional view of the microfiltration system of FIG. 10a, with the microfabricated cap removed.

According to yet another embodiment, shown in FIGS. 10a and 10b, the microfiltration system may comprise a three port direct filter 190. The three port direct filter 190 includes two inlet flow channels 191, 192 for inputting two samples to a filtration chamber 195 and a single outlet channel 193 for conveying a filtered product from the filter 190. The three-port direct filter includes a microfabricated cap 15 defining the filtration chamber and a membrane 110 separating the filtration chamber from the outlet channel 193. In operation, two samples may be provided through the inlet channels 191, 192. The samples mix together in the filtration chamber 195 and the sample mixture is filtered through the membrane, which separates the components of the sample mixture. The filtered product that passes through the membrane is conveyed through the outlet channel for further processing, analysis, collection etc.

One skilled in the art of membrane based separations will recognize that the filtration system described here can be used to implement on-chip separations of all types for which membranes may be found, including separating molecules by size or beads from molecules or small particles from large particles or viruses from cells or other separations known to those skilled in the art.

Figure 11:
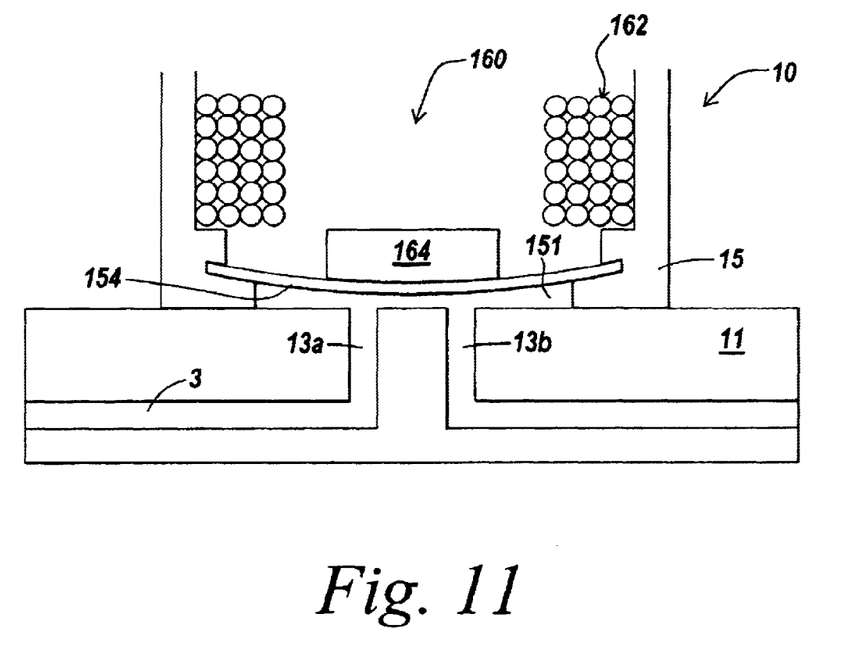
FIG. 11 illustrates an electromagnetic valve incorporated into a microfluidic system according to an embodiment of the invention.

According to another embodiment of the invention, the capping module 15 may be used to incorporate an electromagnetic valve into a microfluidic system. An example of an electromagnetic valve component housed in a capping structure for implementation in a microfluidic system according to the teachings of the invention is shown in FIG. 11. As shown, the electromagnetic module 150 comprises a cap 15 defining an interior chamber 151, a membrane 154 for selectively blocking flow through one or both of the communication ports in the substrate and an actuator assembly 160 for deflecting the membrane 154. According to the illustrative embodiment, the actuator assembly comprises a coil 162 and a magnet 164. One skilled in the art will recognize that other suitable means for deflecting the membrane may be used, including piezoelectric actuators.

The electromagnetic capping module 110 may be stacked on the substrate 11 such that the membrane, when deflected, blocks one or more of the communication ports 13a and 13b. The electromagnetic capping module 110 thus integrates a valve for selectively blocking flow through the channel 3 into the microfluidic flow path. As described above, the electromagnetic capping module may be placed on the substrate using automated "pick and place" equipment or through any suitable means known in the art.

One skilled in the art will recognize that the capping module is not limited to the illustrative embodiment and that other elements may be implemented to add other microfluidic functions, in addition to or in place of, filtration and flow control.

The microfiltration system of the present invention advantageously combines the power and scope of conventional membrane technology with the small volume dynamic flow control inherent in microfabricated/microstructure microfluidic systems. The present invention provides cost effective mixing of any suitable polymer membrane with a microfluidic network. The microfiltration system is simple and inexpensive to add to a microfluidic system, as the incremental cost of assembling the microfiltration system in a microfluidic chip is relatively low above the cost of the microfluidic system itself A microfluidic system according to the present invention may comprise one or more of the above-described components, alone or in combination with other components.

The present invention has been described relative to an illustrative embodiment. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

What is claimed is:

1. A microfluidic system, comprising:
   a first microchannel formed in a substrate;
   a first communication port coupling the first microchannel to a surface of the substrate;
   a second microchannel formed in the substrate;
   a third microchannel formed in the substrate; and
   a capping module having a recess formed therein and having a semi-permeable membrane for separating substances by size exclusion covering the recess to form a chamber, the membrane forming a wall of said chamber, the capping module including an inlet to the chamber and an outlet to the chamber formed therein, wherein the capping module is adapted to be stacked on the substrate, such that the inlet to the chamber is placed in communication with the first microchannel, the outlet to the chamber is placed in communication with the second microchannel, and said membrane is placed in communication with the third microchannel, such that filtrate passing through the membrane enters the third microchannel thereby introducing a microfluidic filtration function into the microfluidic system.

2. The system of claim 1, further comprising a second communication port connecting the second microchannel to a surface of the substrate.

3. A microfluidic system, comprising:
   a substrate having a plurality of microchannels formed therein, wherein each microchannel includes one or more communication ports for connecting the microchannel to a surface of the substrate; and
   a plurality of microfluidic capping modules, each having associated therewith a semi-permeable membrane for performing a microfluidic filtering function disposed over a recess to form a chamber in the associated capping module, an inlet to the chamber, and an outlet to the chamber, and
   wherein a first of said microfluidic capping modules is stacked on the substrate to place one of the inlet and the outlet of the first microfluidic capping module in fluid communication with one or more of the microchannels via a communication port associated with said one or more microchannels to incorporate a first microfluidic filtering function into the system and a second of said microfluidic capping modules is stacked on the substrate to place one of the inlet and the outlet of the second microfluidic capping module in fluid communication with another one or more of the microchannels via a communication port associated with said another one or more of the microchannels to incorporate a second microfluidic filtering function into the system.

4. A microfabricated filtration system, comprising:
   a capping module including a membrane for separating a substance into a first and second component;
   a first flow path for transmitting a substance through the microfluidic system, wherein the capping module intersects the first flow path when the capping module is stacked on a substrate;
   a first reservoir formed in the capping module above the membrane and having an inlet in communication with the first flow path for receiving the substance and having an outlet in communication with the first flow path for conveying the first component from the first reservoir;
   a second reservoir defined in the substrate for receiving the second component of the substance;
   a second flow path in fluid communication with the second reservoir for receiving the second component of the substance; and
   a first flow source in communication with the first fluid path for inducing a flow in the substance, wherein the capping module is stacked on the substrate such that the first reservoir is in communication with the second reservoir and separated from the second reservoir by the membrane, and a substance conveyed along the first flow path is separated into a first component, which passes through the first reservoir and along the first flow path, and a second component, which passes through the membrane and along the second flow path.

5. A microfabricated filtration system, comprising:
   a substrate;
   a first flow path in the substrate for conveying a substance;
   a second flow path formed in the substrate for receiving and conveying a filtered component of the substance;
   a recess formed in the substrate in communication with the second flow path;
   a cap defining a retentate chamber, the cap stacked on the substrate such that the retentate chamber is placed in communication with the first flow path;
   a membrane affixed to the cap to cover the retentate chamber, wherein the membrane is sized for separating the substance into the filtered component and a retained component and is disposed above the recess when the cap is stacked on the substrate to define a filtrate chamber below the membrane, thereby placing the second flow path adjacent to and separated from the first flow path by the membrane;
   a third flow path formed in the substrate in communication with the retentate chamber for receiving and conveying the retained component of the substance from the retentate chamber.

* * * * *